United States Patent [19]

Huykman

[11] 4,337,494
[45] Jun. 29, 1982

[54] AUTOMATIC BIAS-CONTROLLED VMOS/BIPOLAR DUAL-TRIGGERED SWITCH

[75] Inventor: Richard B. Huykman, Lincoln Park, N.J.

[73] Assignee: Reliance Electric Company, Cleveland, Ohio

[21] Appl. No.: 137,564

[22] Filed: Apr. 7, 1980

[51] Int. Cl.$^3$ ............................................. H02H 3/08
[52] U.S. Cl. .................................... 361/86; 361/101; 361/93
[58] Field of Search ...................... 361/86, 93, 98, 101, 361/18; 323/349, 351, 279, 285, 289; 307/253, 300, 571; 330/207 P, 298, 261

[56] References Cited

U.S. PATENT DOCUMENTS

| | | | |
|---|---|---|---|
| 3,896,367 | 7/1975 | Frantz | 323/351 |
| 3,916,220 | 10/1975 | Roveti | 307/251 |
| 4,055,794 | 10/1977 | Ickles et al. | 307/300 X |
| 4,178,619 | 12/1979 | Seiler et al. | 361/18 X |

Primary Examiner—Reinhard J. Eisenzopf
Attorney, Agent, or Firm—Kenneth Watov

[57] ABSTRACT

An automatic bias-controlled power switching system including a bipolar power transistor driven by means of first and second VMOS transistors which are sequentially triggered to initially turn the power transistor on to at least an unsaturated conduction state and thereafter to drive the power transistor into saturation. The VMOS transistors are turned off in sequence so that when turned off the power transistor is initially brought into an unsaturated conduction state after which it is completely turned off. An automatic gain control system monitors the bipolar power transistor and varies the base current thereto so that the operating point of the power transistor remains fixed. A fault detection system is provided to turn off the bipolar power transistor when excessive current is demanded by the load on the transistor. In addition, a base current limit control system monitors the level of the base current and, when the base current exceeds a predetermined limit, at least one of the VMOS transistors are controlled to reduce the base current to the predetermined desired maximum level.

26 Claims, 10 Drawing Figures

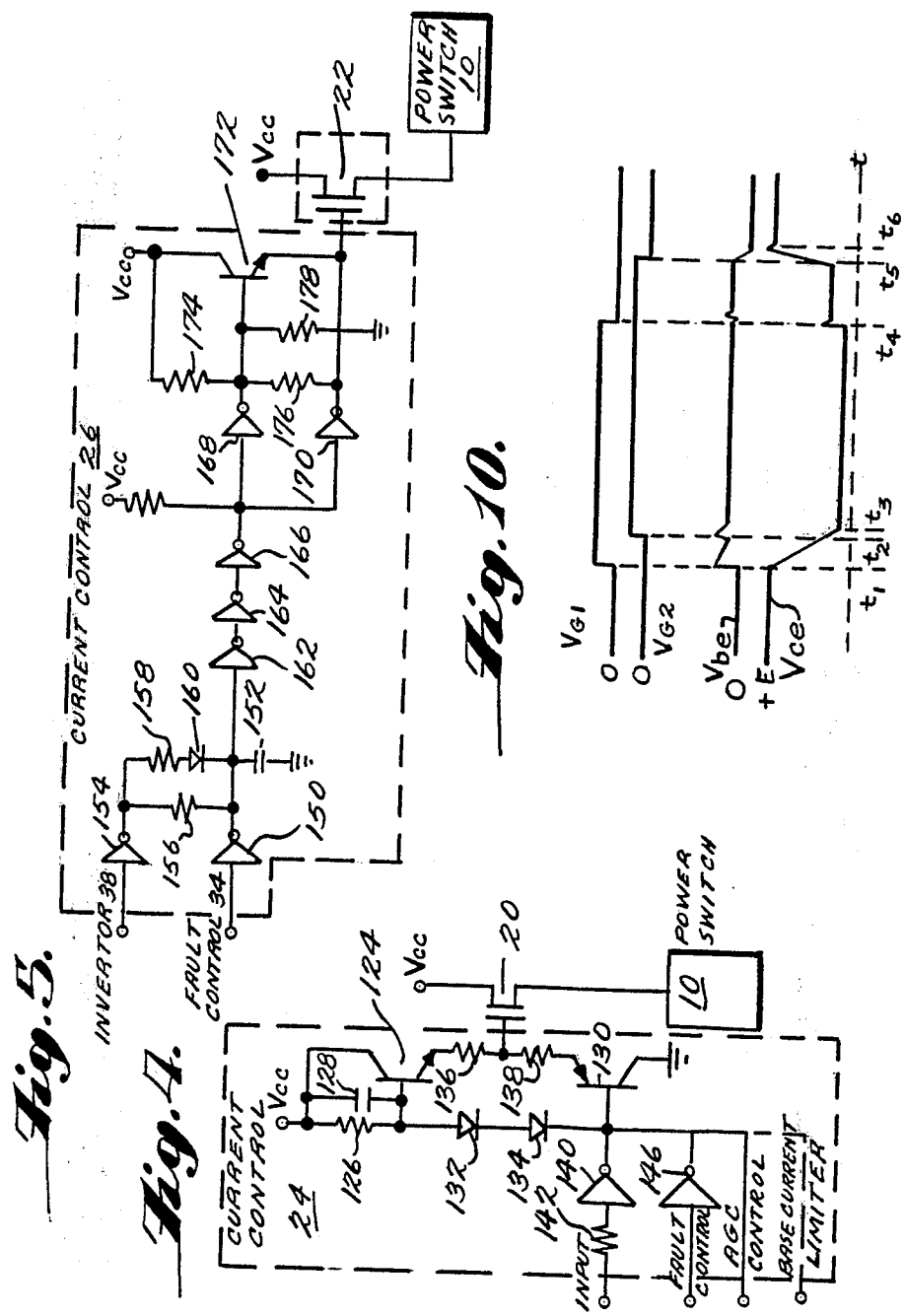

AUTOMATIC BIAS-CONTROLLED VMOS/BIPOLAR DUAL-TRIGGERED SWITCH

CROSS-REFERENCE TO RELATED APPLICATIONS

This invention is related to United States patent applications Ser. No. 41,008, filed on May 21, 1979, for VMOS/BIPOLAR POWER SWITCH; to Ser. No. 40,991, filed on May 21, 1979, for VMOS/BIPOLAR SWITCHING DEVICE; and to Ser. No. 40,989, filed on May 21, 1979, now, U.S. Pat. No. 4,286,175, for VMOS/BIPOLAR DUAL-TRIGGERED SWITCH; all of which are assigned to the common assignee herewith.

BACKGROUND OF THE INVENTION

The field of the present invention relates generally to the automatic control of the transient and steady-state characteristics of power switching circuits and devices, and more specifically to the automatic control of power switching circuits and devices having bipolar and field effect transistors.

A VMOS/bipolar transistor dual-triggered power switch is discussed in the U.S. patent application of Baker, Ser. No. 40,989, which is assigned to the common assignee herewith. The power dissipation of the VMOS/bipolar dual-triggered switch is minimized by controlling the turn-on and turn-off characteristics of a highpower bipolar transistor which is included in the switch and by maintaining the power output transistor in a controlled state of saturation during steady-state on operation. The steady-state current supplied to the base of the power transistor is preferably controlled by a VMOS device, however certain parameters of VMOS and bipolar transistors prevent precise control of such base current. These parameters include the transconductance of the VMOS device, the base-emitter resistance of the power output transistor, and the base-emitter voltage of the power output transistor, each of which varies from device to device and with temperature. The disadvantage created by imprecise control of the base current for the power transistor is that the depth of saturation of the power transistor cannot be precisely set. Accordingly, power is lost because of excessive steady-state current applied to the base of the power output transistor and because of imprecise and unrepeatable control of the turn-off characteristics of the output power transistor.

Techniques are known in the art for controlling current flow through transistors. Thus, it is generally known in the art to sense the amount of current flowing through a resistor and to operate an electronic switch when the current exceeds a predetermined value. Such an apparatus is disclosed in Roveti, U.S. Pat. No. 3,916,220. The Roveti apparatus, however, is not used in a combination VMOS/bipolar dual-triggered switch and does not teach how to minimize steady-state power dissipation by precisely controlling the level of saturation of a power transistor. Furthermore, Roveti does not teach how to improve the precision and speed of switching time control by controlling base current to the power output transistor. Accordingly, there is a need in the art for an improved power switching device.

SUMMARY OF THE INVENTION

The present invention relates to an improved power switching device having a relatively high-power bipolar transistor to which is supplied a first or primary base current to drive the transistor initially into a saturated conduction state. A second or transient base current is subsequently supplied to the base of the power transistor to drive the power transistor further into saturation. When the power transistor is turned off, one of the first or second currents supplied to the base of the power transistor is initially inhibited to place the power transistor into an unsaturated conduction state. Thereafter, the other of the base currents is removed to complete the turn off of the transistor. An AGC control network senses the voltage across the base-collector terminals of the power transistor and as the transistor moves out of saturation, a feedback signal is generated to a current driver for increasing base current flow to the transistor to drive the transistor back into a predetermined saturation state. A fault detection circuit is also provided for detecting the change of voltage across the base collector terminal of the power transistor and when the power transistor is overloaded, the fault detection circuit generates a base current inhibiting signal to inhibit both the first and second base currents. Both the AGC control circuit and the fault detector circuit are inhibited from controlling or inhibiting base current drive during the initial turn-on operation of the power transistor. In addition, in one embodiment, both the AGC circuit and the fault detection circuit are inhibited during the turn-off cycle of the power switch.

In a second embodiment of the invention, the fault detection circuit is operable during the turn-off cycle, but the trip point for detecting when the power transistor has reached a fault condition is varied to account for the unsaturated operation of the power switch during the turn-off cycle.

In an alternative embodiment, a base drive current limiting circuit is provided for detecting the level of base current and for limiting the value of this base current to a predetermined level so that the power transistor is not damaged by excessive base current drive.

BRIEF DESCRIPTION OF THE DRAWINGS

Other objects, features and advantages of the present invention will become more fully apparent from the following detailed description of the preferred embodiments, the appended claims, and the accompanying drawings in which:

FIG. 4 is a schematic diagram of a primary current driver according to the preferred embodiment of the present invention;

FIG. 5 is a schematic diagram of a transient current driver according to the preferred embodiment of the present invention;

FIG. 10 is a graphical illustration of waveforms relating to the switching characteristics of the circuit of the present invention.

DETAILED DESCRIPTION OF THE PREFERRED EMBODIMENTS

Figure 1:
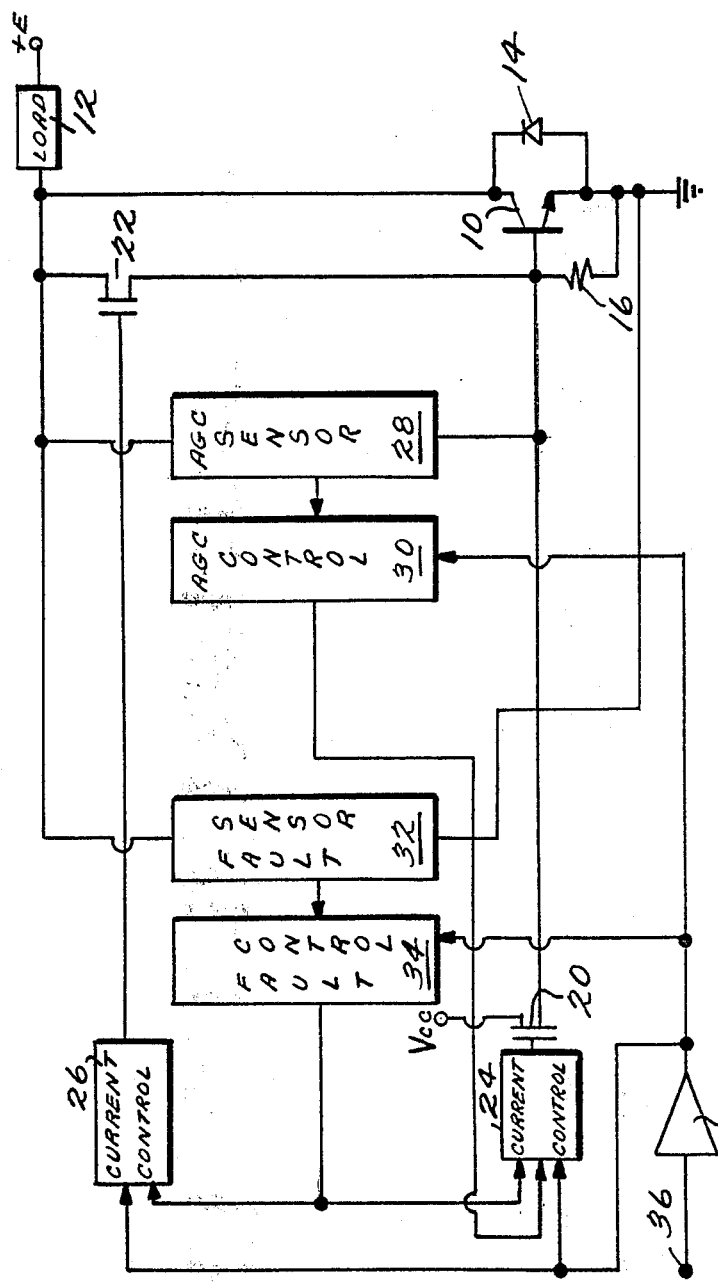
FIG. 1 is a simplified block diagram of the preferred embodiment of the present invention.

The preferred embodiment of the present invention as shown in FIG. 1 is a relatively high-power solid-state switching system which is precisely controlled to provide very fast turn on and turn-off times and relatively low power dissipation. The switching circuit includes a power output switch 10 which may be in a form of a single NPN bipolar power switching transistor, as shown, or a parallel combination of two or more of such bipolar power switching transistors. The collector electrode of the transistor 10 is connected to a load impedance 12 which, in turn, is connected to an operating voltage +E. The emitter terminal of the power transistor is connected to a reference terminal such as ground. In a typical application of the switching circuit of the present invention, the load impedance is inductive and the operating voltage +E is several hundred volts. Accordingly, a diode 14 having an anode connected to the emitter and a cathode connected to the collector of the power transistor 10 permits bilateral current flow in a manner known in the art. Preferably, a resistor 16 having a low resistive value is connected between the base and the emitter terminal of the power transistor forming the power switch 10 for the purpose of insuring that the power transistor is held off when zero bias is applied to the base thereof. As an alternative, a VMOS device or other FET may be used in place of the resistor 16 and connected as known in the art in order to maintain a nonconductive path between the base and emitter of the transistor 10 while current is supplied to the base and to maintain a conductive path when no current is supplied to the base. This assures that zero bias is applied to the base when the transistor 10 is turned off and decreases the turn-off time of the transistor when the switch is turned off.

Base current to the transistor 10 is preferably provided by means of a pair of VMOS transistors 20 and 22. The unique advantages to using VMOS transistors in combination with the bipolar output power transistor 10 are described in the aforementioned U.S. patent applications, the subject matter of which is incorporated herein by reference thereto. As illustrated in FIG. 1, VMOS transistor 20 has its drain terminal connected to an operating voltage source $V_{CC}$ which may, for example, be 12 volts. The source terminal of the transistor is connected to the base of the bipolar power transistor 10 and the gate terminal is connected to the current control circuit 24. The VMOS transistor 20 provides primary base control current to the power transistor 10. The transistor 20 is controlled by means of a current control circuit 24 which provides an appropriate bias to the gate of the VMOS 20, either from an external logic control system (not shown), from a fault detector or from an automatic gain control (AGC) system which will be explained more fully hereinbelow.

The VMOS transistor 22 provides secondary or transient current control to the base of the power transistor 10. VMOS transistor 22 has its source terminal connected via load 12 to the operating voltage +E and its drain terminal connected to the base of power transistor 10. The gate of transistor 22 is connected to a second current control device 26 which controls transistor 22. Current control circuit 26 provides an appropriate bias to the gate of VMOS 22 in response to a signal from an external logic control system or from the fault detector system which, as aforementioned, will be explained hereinbelow.

In operation, a first pulse $V_{G1}$, as illustrated in FIG. 10, having a positive polarity of appropriate amplitude is applied at time $t_1$ to the gate terminal of the VMOS 20 to turn on the VMOS transistor. Accordingly, the resistance between the drain and source electrodes decreases to thereby permit current to flow from the voltage source $V_{CC}$ into the base electrode of the bipolar transistor 10. In general, the value of the operating voltage $V_{CC}$ is substantially less than that of the operating voltage +E which is applied to the collector terminal of the bipolar power transistors via the load 12. Additionally, the value of the operating voltage $V_{CC}$ is set at a level for providing a magnitude of base current equal to $V_{CC}/r_S$ where $r_S$ is the channel resistance of the VMOS transistor 20 when conductive so that the power transistor 10 turns on into or as close to a saturated state of conduction as possible depending, of course, upon the characteristics of the load 12. While the transistor 20 is preferably a VMOS transistor, it should be understood that other low-power, high-speed switching transistors could be utilized in place thereof.

Just after the power transistor 10 is turned on, a second pulse $V_{G2}$ at time $t_2$ having a positive polarity of appropriate amplitude is applied to the gate of the VMOS transistor 22. The magnitude of the base current now applied to the power transistor 10 is equal to the sum of the first or primary current supplied from transistor 20 and the secondary or transient current supplied from transistor 22. The staged current drive from the two transistors 20 and 22 drive the power transistor into or as near saturation as possible by turning on VMOS transistor 20 before VMOS transistor 22. This avoids turning on transistor 22 at a time when the voltage at the collector terminal of the power transistor 10 is at a maximum value. In this manner the initial magnitude of current which flows through the drain-source current path of transistor 22 is substantially reduced when it is first turned on. The time between $t_1$ and $t_2$ can be reduced to substantially zero in certain applications where the load impedance 12 is such that the power transistor 10 is readily saturated and operated at nominal power levels relative to its rated power. However, in loads which are inductive, the impedance of the load decreases with time and, accordingly, loading on the power transistor 10 increases with time. Thus, the necessity for having dual base current drive for the power transistor.

The power transistor is turned off from its saturated conduction state by typically removing, in sequence, the control pulses from the gate terminal of transistor 20 first and then from the gate terminal of transistor 22. In this manner, the power transistor 10 is turned off by first placing it back into its unsaturated conduction state for a brief period of time as shown by waveform $V_{ce}$ in FIG. 10. Then, the base current is completely removed by turning off VMOS transistor 22 thereby turning off power transistor 10.

By controlling the magnitude of the current supplied to the base electrode of the power transistor in stages, that is, by first driving the power transistor toward a saturated conduction state, but not necessarily into saturation, and thereafter into or to as close to a saturated conduction state as possible, the effects of the time delay in turn-on and rise time $t_r$ are minimized. It is preferred, if possible, to operate the power transistor 10 in a saturated conduction state during a substantial period of time in order to minimize power dissipation. In addition, by first changing the conduction state of the power transistor from a saturated to an unsaturated state just prior to turning the transistor completely off, the effects of storage time due to the Miller capacitance is minimized. In practice, it has been determined that by carefully controlling the phase relationship between the leading and trailing edges of the first and second control pulses $V_{G1}$ and $V_{G2}$ for the VMOS transistors 20 and 22, a bipolar power transistor arrangement operated in a dual-triggering configuration can typically be turned on into a saturated conduction state from the cut-off state in substantially less time than turning on from cut-off directly to a saturated conduction state in prior triggering configurations. Similarly, the power transistors can typically be turned off in substantially less time from a saturated conduction state to cut-off using the dual triggering method than directly from a saturated conduction state using a single triggering method.

Refer now back to FIG. 1 where the automatic gain control (hereafter AGC) and fault detection circuits will be explained. As aforementioned, the most efficient way of operating a power switch is to keep it in a desired saturated state as long as the maximum base current and collector current for the power switch have not been exceeded. If the base current is controlled so that the degree of saturation is independent of load, several advantages are obtained, particularly when the load is inductive. Thus, power is conserved by providing just the right amount of base current drive to support the load current so that the transistor is in the predetermined desired state of saturation. The fixed state of saturation voltage also allows for more precise and repeatable control of the turn-off time with minimum power dissipation as is explained more fully in the aforementioned co-pending Baker application. In the present invention an AGC sensor 28 detects the base-collector voltage across the power transistor 10. As the power transistor 10 moves out of saturation due to an increasing load, the base-collector voltage will increase. In turn, this increase in voltage is sensed by the AGC sensor 28 which provides an output signal to an AGC controller 30. The AGC controller 30, in response thereto, provides a signal to the VMOS transistor drive circuit 24 which causes the VMOS 20 to turn further on accordingly providing more base current for driving the power transistor 10 back into saturation. Thus, VMOS 20, in combination with the AGC sensor 28 and AGC controller 30 provide a proper base current for the output transistor 10 making the operating point of this transistor independent of variations of current gain (beta) and collector-to-emitter saturation resistance variations from device to device and independent of temperature and load variations. The AGC system will be disclosed more fully in connection with the description of the circuitry of FIG. 2.

A fault sensor 32 is connected across the base and collector terminals of the power transistor 10 to detect an overload condition. When the output load current requirement is excessive, the power transistor moves out of saturation, thus causing the collector voltage to rise. This will occur when the maximum base current from VMOS transistors 20 and 22 is insufficient to support the required collector current in the power transistor. When the base-collector voltage of the power transistor 10 goes above a predetermined level, the fault sensor 32 is tripped or activated and provides a signal to a fault control circuit 34. The fault control circuit provides an output signal to the VMOS current control circuit 24 for VMOS 20 and to the VMOS current control circuit 26 for VMOS 22 thereby turning off both VMOS transistors 20 and 22. Hence the power transistor 10 is turned off. The fault control circuit will be discussed more fully in connection with the circuitry of FIG. 3.

The power transistor 10 is externally controlled by a signal at terminal 36 from a logic control circuit (not shown). The control signal at terminal 36 is inverted by inverter 38 and coupled to current control circuits 24 and 26. In addition, the output of inverter 38 is coupled to AGC control circuit 30 and fault control circuit 34 to enable these circuits a predetermined time after the transistor 10 is initially turned on and to inhibit these circuits when the power transistor 10 is turned on. The timing of the operation of the fault and AGC control circuits will be explained more fully below.

Figure 2:
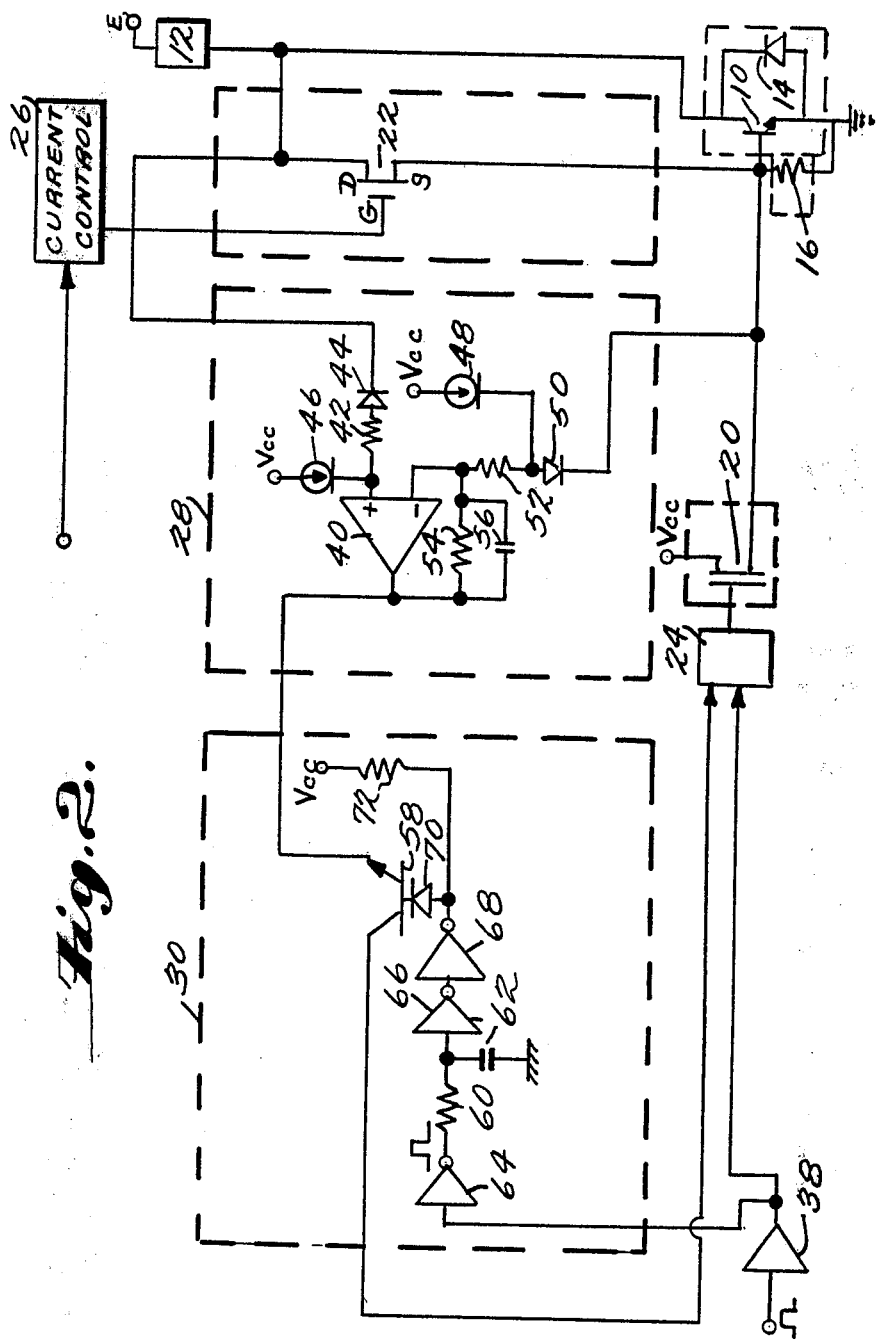
FIG. 2 is a schematic diagram of an automatic gain control system according to the preferred embodiment of the present invention.

Refer now to FIG. 2 which is a more detailed schematic illustration of the AGC circuitry of the present invention. As illustrated, the source of the VMOS device 22 is connected to the base of the power transistor 10, the drain is connected to the collector thereof and to load 12 and the gate is connected to driver circuit 26. The source of the VMOS device 20 is connected to the base of the power output switch 10, the drain is connected to the supply voltage $V_{CC}$ and the gate is connected to the driver circuit 24.

The AGC sensor 28 has two input circuits. In the first input circuit, the non-inverting or positive terminal of a conventional operational amplifier 40 is connected via resistor 42 and diode 44 to the collector of the power transistor 10. The diode 44 must have a high reverse-bias rating in order to protect the operational amplifier from the voltage +E which may be, for example, 500 volts. In order to provide bias current, a constant current diode 46 is connected to the operating voltage $V_{CC}$ at one end and to resistor 42 and the non-inverting input of the operational amplifier 40 at the other end. The current flow through diode 46 passes entirely through resistor 42 because of the high internal input resistance of the operational amplifier 40. This creates a voltage drop across resistor 42 equal to the desired depth of saturation of the power transistor 10.

The second input circuit includes an offset circuit having a constant current diode 48 which is connected to the operating voltage $V_{CC}$ and which, preferably, is of the same value as the constant current diode 46. An offset diode 50 is connected between the constant current diode 48 and the base terminal of the power switch 10. The anode of the diode 50 is connected via resistor 52 to the inverting or negative input of the operational amplifier. In order to control gain and bandwidth, a feedback circuit including resistor 54 and capacitor 56 are connected between the output of the operational amplifier and the inverting input thereof. The combination of resistors 52 and 54 sets the gain of the operational amplifier while the capacitor 56 sets the bandwidth of the amplifier.

In operation the constant current diode 48 conducts current through diode 50. The offset voltage generated across the diode 50 is added to the base voltage of the power output transistor 10 and this exactly offsets the voltage across diode 44 which is added to the collector voltage of the power transistor 10. Thus, the amplifier 40 linearly amplifies the voltage difference between the collector and base of the power output transistor 10.

The output of the AGC sensor 28 is connected to the AGC controller 30. The AGC controller 30 is provided to control when the output of the AGC sensor will control the driver 24 for the VMOS device 20. The output of the operational amplifier 40 is connected to the emitter of an NPN bipolar transistor 58. The collector of this transistor is connected to VMOS driver circuit 24.

The transistor is controlled in an on or off state by means of an input control signal from a switch control logic circuit (not shown) via inverter 38. The input signal is coupled to an RC circuit including resistor 60 and capacitor 62 via inverter 64. The junction of the resistor and capacitor is connected to the input of a series of inverters 66 and 68, the output of which is connected to the base terminal of transistor 58 via a diode 70. The output of inverter 68 is also connected to the operating voltage supply $V_{CC}$ by resistor 72.

In operation, when the power switch 10 is first turned on, it is desirable to inhibit operation of the AGC system. The reason for this is that during turn on, the power output transistor 10 has a high current gain, i.e., high beta, before becoming saturated. In addition, the load 12 typically is inductive and, accordingly, during turn on the power transistor 10 acts as a high gain amplifier. The AGC sensor 28 and AGC controller 30 provide a feedback system between the output of the power transistor 10 and the input thereof via VMOS device 20 and VMOS driver circuit 24. This feedback system provides high voltage and high current gains which can cause unwanted and uncontrollable oscillations during turn on. For this reason, when the power transistor is first turned on, it is desired that the transistor 58 be turned off to prevent feedback which might generate such unwanted oscillations in the power transistor 10.

As explained above, the VMOS device 20 is turned hard ON as a result of the response of the driver current 24 to the leading edge of the switch control signal from inverter 38. Accordingly, maximum primary current is provided to drive ON the power output transistor 10. Typically, in less than one microsecond with respect to the gate voltage of the VMOS device 20, the VMOS device 20 is turned hard ON. The effect of the transient current provided by the VMOS device 20 to the power switch is to rapidly collapse the Miller capacitance and supply additional current to assure that the power output transistor 10 goes into a saturated conduction state. Prior to turn on, the anode of diode 70 is held to the common reference potential by inverter 68. Thus, the transistor is non-conductive and will isolate the driver circuit 24 from the output of the operational amplifier 40. After turn on, the anode of the diode 70 will continue to remain at the common reference potential until the capacitance-resistance network comprising the resistor 60 and the capacitor 62 charges to a predetermined potential. The time constant of the resistance-capacitance network consisting of the resistor 60 and the capacitor 62 is preferably adjusted to approximately 10 microseconds. When the capacitor 62 charges to the predetermined potential, a signal promulgates through inverters 66 and 68. The voltage at the anode of the diode 70 rises to approximately the operating voltage $V_{CC}$. The transistor 58 is thereby turned ON and provides a conduction path from the operational amplifier 40 to the VMOS driver 24. At this point in time, however, the power output transistor 10 has been driven into saturation and its gain has decreased to a low value. Thus, the output power transistor 10 is now acting as a switch instead of an amplifier. The AGC sensor 28 can now effectively control the depth of saturation of the power output switch 10 to the desired level. Thus, the effect of isolating the AGC sensor 28 from the driver 24 until the power output switch 10 has saturated and until the ringing due to lead inductance has dampened is to facilitate high gain automatic control of the degree of saturation of the power output switch 10, with fast response and without oscillation.

Figure 3:
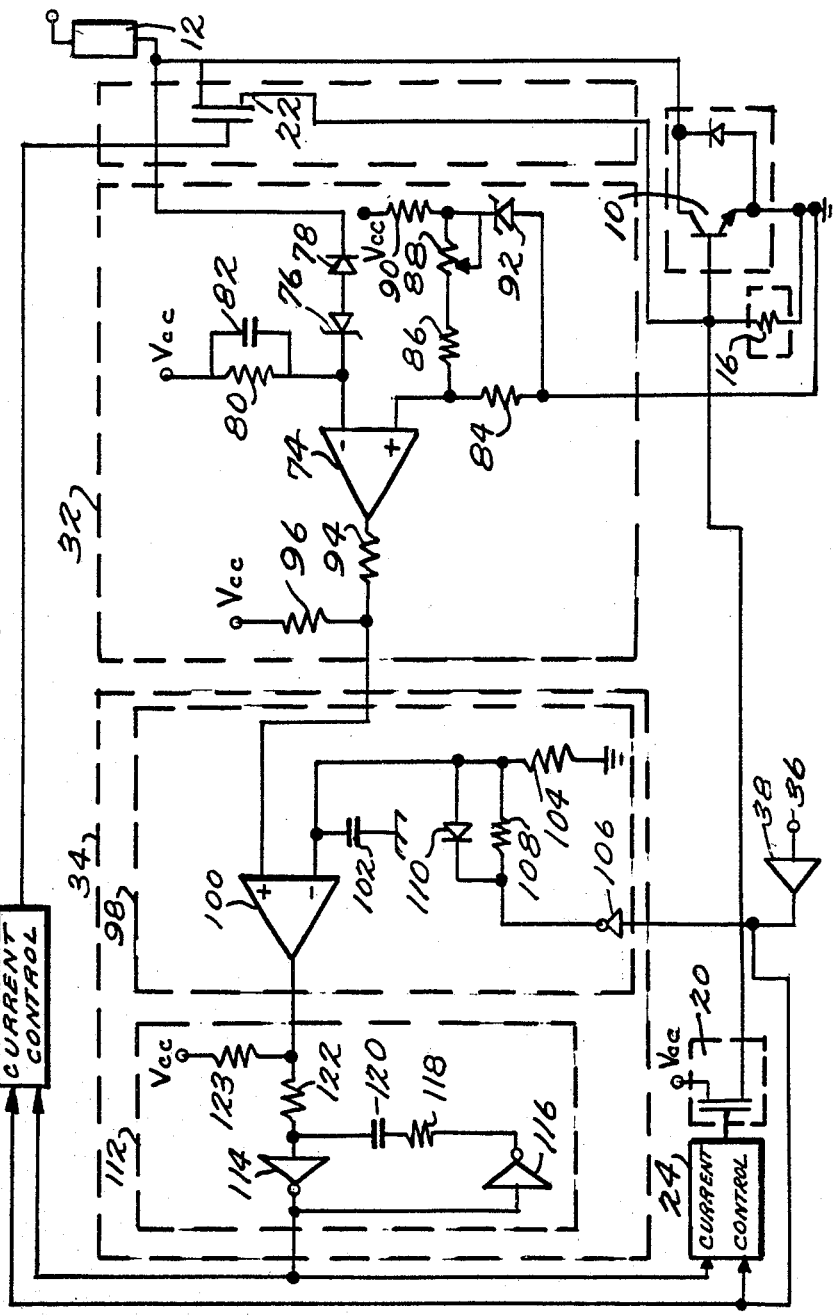
FIG. 3 is a schematic diagram of a fault detection system according to the preferred embodiment of the present invention.

Refer now to FIG. 3 which is the preferred embodiment of the fault sensor 32 and the fault controller 34 of FIG. 1. The fault sensor includes an operational amplifier 74 having an inverting input which is connected to the collector terminal of the power transistor 10 via Zener diode 76 and protection diode 78. Diode 78 must have a sufficiently high reverse-bias rating to protect the operational amplifier 74 from the high operating voltage +E. The Zener diode 76 is provided to establish the normal (no-fault) input to the operational amplifier 74 several volts higher than the saturation level voltage at the collector of the output power transistor 10. The Zener diode 76 is maintained in its active region by means of current supplied from source $V_{CC}$ through resistor 80. A capacitor 82 is utilized to filter noise signals from the input of the operational amplifier 74. The non-inverting input of the operational amplifier 74 is connected to a variable voltage by the voltage divider comprising resistors 84, 86, 88 and 90. Resistor 90 is connected to an operating supply voltage $V_{CC}$ at one end and to a variable resistor 88 at the other end. The resistance of resistor 88 is varied to thereby vary the input voltage to the non-inverting input of the operational amplifier 74. Zener diode 92 is connected between resistor 90 and the ground.

When the power output transistor 10 is operated in a steady-state saturated conduction state, i.e., in a no-fault condition, the voltage between the collector and emitter of the power output transistor is low, e.g., on the order of approximately one volt. The voltage applied to the inverting input of the operational amplifier 74 is lower than the voltage applied to the non-inverting input of the operational amplifier. Accordingly, the output thereof rises to the level of the operating voltage $V_{CC}$. When a fault occurs, however, the voltage across the collector and emitter of the power output transistor 10 rises. This causes the voltage applied to the inverting input of the operational amplifier 74 to rise above the level of the voltage applied to the non-inverting input thereof. Accordingly, the output of the operational amplifier 74 falls toward the common reference potential, which in the preferred embodiment is zero volts. The resistors 94 and 96 which are connected between the operating supply voltage $V_{CC}$ and the output of the operational amplifier are selected such that the voltage at the node between these resistors never goes below one-third of the operating voltage $V_{CC}$. Thus, the output of the fault sensor 32 is at or near the operating voltage $V_{CC}$ during normal operation of the power output transistor 10 and is at a value no less than one-third of the operating voltage $V_{CC}$ when a fault condition occurs.

The output of the fault sensor 32 is coupled to a gate 98. Since the non-saturated turn-off condition of the switch 10 occurs very quickly as a result of storage charge control, fault protection is usually unnecessary during the turn-off operation. However, the gate circuit 98 serves to isolate the output of the fault sensor from the driver circuits 24 and 26 both during the time in which turn on of the power transistor occurs and when non-saturated turn off occurs.

Gate 98 includes an operational amplifier 100 having the output of the fault sensor 32 connected to its non-inverting input. A capacitor 102 and resistor 104 connected in parallel are connected to the inverting input of the amplifier 100 with the other ends of these elements connected to the reference potential. The input from a logic switch control circuit is coupled from inverter 38 to an inverter 106 which in turn is connected to the inverting input of the operational amplifier 100 via resistor 108 and diode 110. In operation, when a turn-ON signal is applied to the input terminal 36, the output of the inverter 106 will be at the operating voltage $V_{CC}$ and, accordingly, the diode 110 is reverse-biased. The capacitor 102 will therefore charge to a voltage depending upon the respective values of resistors 104 and 108. These resistors are chosen such that the voltage input under steady-state conditions at the non-inverting input of the operational amplifier 100 will be two-thirds $V_{CC}$. Accordingly, if the power output switch 10 is in a steady-state operating phase, the non-inverting input to the operational amplifier 100 will be higher than that of the non-inverting input and, accordingly, the output of amplifier 100 will be high. However, if a fault condition exists at the output of the transistor 10, the non-inverting input voltage to the operational amplifier 100 will be approximately one-third of the operating voltage which is less than the voltage applied to the inverting input thereof. Accordingly, the output of the operational amplifier 100 will go low thereby indicating a fault. It is to be understood that the time required to charge capacitor 102 to a level sufficient to allow a fault signal to be provided at the output of amplifier 100 is greater than the time required, in the absence of a fault, for the power output transistor 10 to reach a steady-state saturation state in which the fault sensor 26 would not erroneously indicate a fault.

When a turn-OFF signal is present at input terminal 36, the power output transistor 10 is either in an off conduction state or in the non-saturated turn-off stage of operation. In either case, fault sensor 32 would generate a signal indicating a fault. It is desirable to prevent this fault signal from being applied to the inputs of the VMOS driver circuits 24 and 26. The output at inverter 106 will go to the common reference potential when the turn-off signal is present at terminal 36 and, accordingly, diode 110 is forward-biased and will quickly bring the potential at the inverting input of the operational amplifier 100 to a potential equal to the voltage drop across the diode 110. Since the non-inverting input of the operational amplifier 100 will either be at the operating voltage $V_{CC}$ or, at the least, at or near one-third of the operating voltage $V_{CC}$, while the other input is at ground potential, the output of the operational amplifier 100 will be high or in a no-fault condition. Thus the fault system will not operate to control base current to the transistor switch 10 when the power switch is being turned off.

The fault controller 34 also includes a local trip circuit 112 which is responsive to the output of the gate circuit 98 to signal a fault condition in the power output switch 10. This circuit responds with an internal delay so that functioning of the power output transistor is not defeated by a transient fault after which steady-state functioning resumes. In the local trip circuit 112 are a set of inverters 114 and 116 having a resistor 118 and a capacitor 120 connected between the output of inverter 116 and the input of inverter 114. In the steady-state no-fault operation of the power output transistor 10, the output of the gate circuit 98 is high. This output is inverted by the inverter 114 and the resulting low output of the inverter 114 indicates a no-fault condition. This signal is coupled to each of the VMOS current drivers 24 and 26. Inverter 116 inverts the output of inverter 114 and the capacitor 120 charges through the resistor 118.

When a fault condition occurs, the output of the gate circuit 98 goes low. However, the input to the inverter 114 does not immediately change because capacitor 120 must discharge through resistor 122 for a time period determined by the value of the capacitor 120 and a resistor 122. If during this time period the fault is corrected, the output of the gate circuit 98 will go high and the capacitor 120 will again charge through resistor 122 with the same predetermined time constant. On the other hand, if the output of the gate circuit 98 remains low indicating that the fault remains, the capacitor 120 will discharge through resistor 122 to the point where the output of the inverter 114 will go high, thereby indicating a fault condition. When this occurs, the output of the inverter 116 goes low and capacitor 120 will discharge through the resistor 118.

Refer now to FIG. 4 which shows a preferred embodiment of the driver circuit 24 of the present invention. The driver circuit 24 serves to controllably provide a gate control voltage to VMOS transistor 20 which, as aforementioned, provides the primary current for the power bipolar transistor switch 10. In the VMOS driver circuit 24, the operating voltage $V_{CC}$ is connected to the collector of an NPN transistor 124 and to the base thereof via resistor 126 and capacitor 128. This operating voltage is also coupled to the base terminal of a PNP transistor 130 via diodes 132 and 134. The emitter of transistor 124 is connected to the emitter of transistor 130 via resistors 136 and 138, respectively. The common junction of resistors 136 and 138 are connected to the gate terminal of the VMOS transistor 20. The collector terminal of transistor 130 is connected to the common reference potential.

Figure 9:
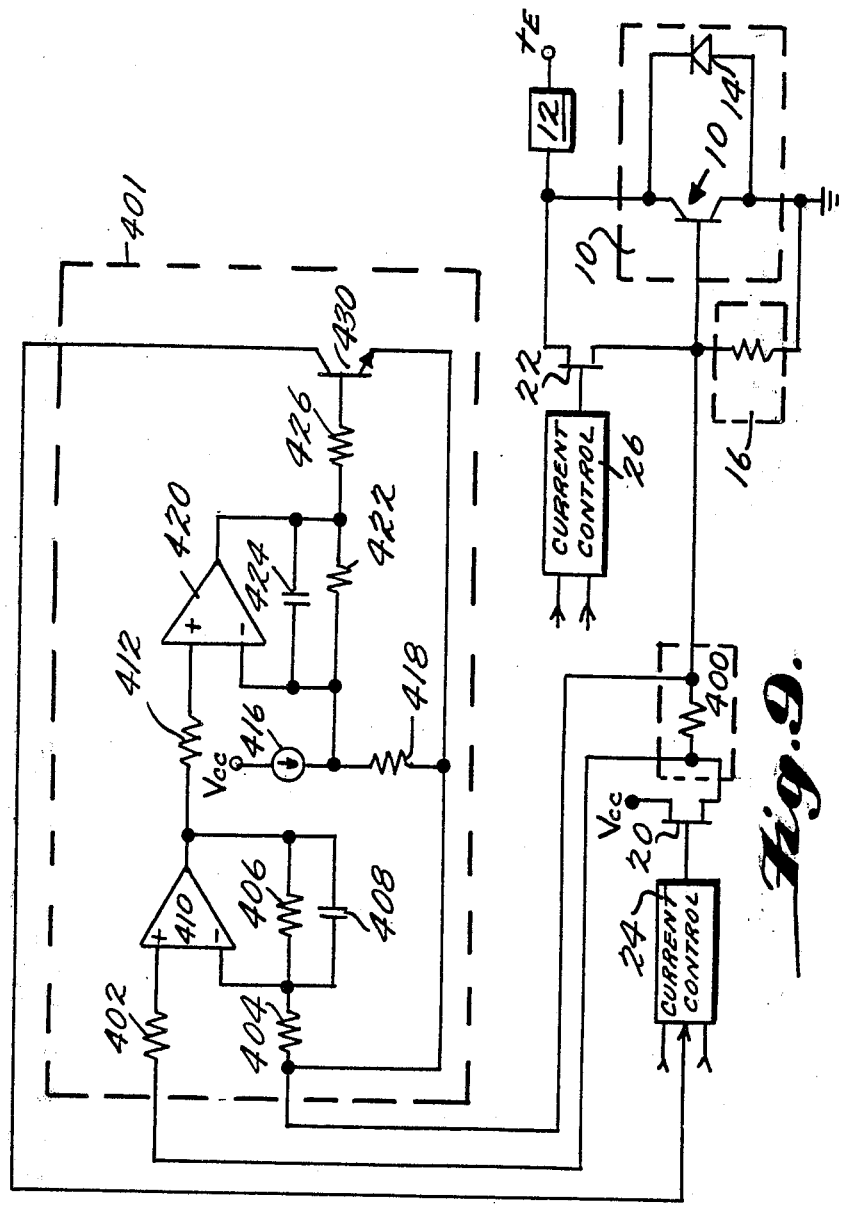
FIG. 9 is a schematic diagram of a primary current sensing element and a primary current limiting controller according to the present invention.

Three input circuits are connected to the base of transistor 130. The first input circuit includes an inverter 140 and an input resistor 142 which are connected to the inverter circuit 38 which receives the input control commands from a switch logic circuit. The second input circuit is connected to the fault controller circuit 34 and receives the output of inverter 114 in the local trip circuit and couples this signal via inverter 146 to the base of transistor 130. The third input circuit is connected directly to the output of the automatic gain control circuit 30. A fourth input is shown in phantom, which is converted to a maximum base current control circuit such as illustrated in FIG. 9, if desired.

In operation, when an input signal is received from a logic control circuit via inverter 38 for turning the power transistor on, a low signal is received at the input of inverter 140. The output thereof will go high and, accordingly, transistor 130 is turned off and transistor 124 is turned on. The voltage at the input gate of the VMOS transistor 20 goes positive to thereby turn on this transistor to provide a base drive current for the power transistor 10. Should the input control signal coupled to the inverter 38 go low indicating that the power switch is to be turned off, a high input signal is coupled to the input of inverter 140 and, accordingly, the output thereof goes low. This causes transistor 130 to turn on and because of diodes 132 and 134 the base of transistor 124 goes low to turn this transistor off. Accordingly, the bias voltage at the gate of VMOS transistor 20 goes low to thereby inhibit current flow to the base of the power transistor 10.

When the power switch 10 is turned on and after the 10 microsecond interval required to permit operation of the AGC controller, as was discussed in connection with FIG. 2, an AGC signal is applied to the base of transistor 130. As the voltage of the AGC signal increases indicating that the switch 10 is moving out of saturation, the voltage across the emitter-collector terminals of transistor 130 increases while that across the emitter-collector terminals of transistor 124 decreases. Accordingly, a higher voltage is applied to the gate terminal of the VMOS transistor 20 to thereby cause more base current to be supplied to the power output transistor 10 so that transistor 10 is driven further into saturation. The opposite occurs when the transistor switch 10 moves further into saturation. Accordingly, transistors 124 and 130, in combination with the AGC control circuitry, control the appropriate level of primary base current to the power transistor 10.

Refer now to FIG. 5 which is a schematic diagram of the VMOS driver circuit 26 for driving VMOS transistor 22.

The driver circuit 26 includes a first input from the fault controller circuit 34 which is coupled to inverter 150, the output of which is coupled to one side of a capacitor 152, the other side of which is connected to the common reference potential. The other input circuit is connected to the input inverter 38 which receives the control signals from the logic switching circuit. This input is connected to an inverter 154, the output of which is connected to the capacitor 152 via resistor 156 and the series combination of resistor 158 and diode 160. When the inverted turn-on signal from inverter 38 is coupled to the input of inverter 154, the output thereof goes high. Accordingly, capacitor 152 charges to the level of the output voltage of the inverter 154 through the parallel combination of the resistor 156 and the resistor 158 and diode 160. When the capacitor 152 has been sufficiently charged, the turn-on signal promulgates through the series combination of inverters 162, 164 and 166. The output of inverter 166 goes low thereby clamping the inputs of the inverters 168 and 170 low. The inverters 168 and 170, which are of the open collector type, release the base and emitter of transistor 172. The transistor 172 is driven into conduction because of the voltages established at the base and emitter thereof by the voltage divider comprising resistor 174, 176 and because of the base resistor 178 and the high input impedance of the VMOS device 22. The gate capacitance of the VMOS device 22 is thereby rapidly charged and the VMOS transistor 22 turns hard ON.

When the turn-off signal is applied, the output of the inverter 154 goes low and, accordingly, the capacitor 152 discharges through the resistor 156. The discharge time is longer than the charging time because current flow through resistor 158 is blocked by the reverse-biased diode 160. When the voltage across the capacitor 152 reaches a predetermined level, the turn-off signal promulgates through the inverters 162, 164 and 166. When this occurs the outputs of the inverters 168 and 170 go low so that transistor 172 is turned off. The VMOS device 22 is thereby rapidly turned off.

If a fault condition occurs while the VMOS 22 is in an ON condition, the output of the inverter 150 will go low thereby immediatly discharging capacitor 152. Accordingly, the output of inverter 166 will go high. The outputs of the inverters 168 and 170 will, accordingly, go low to thereby turn off transistor 172. With transistor 172 turned off, the VMOS transistor 22 will be turned off to thereby inhibit secondary base drive current to the output power transistor 10.

Figure 6:
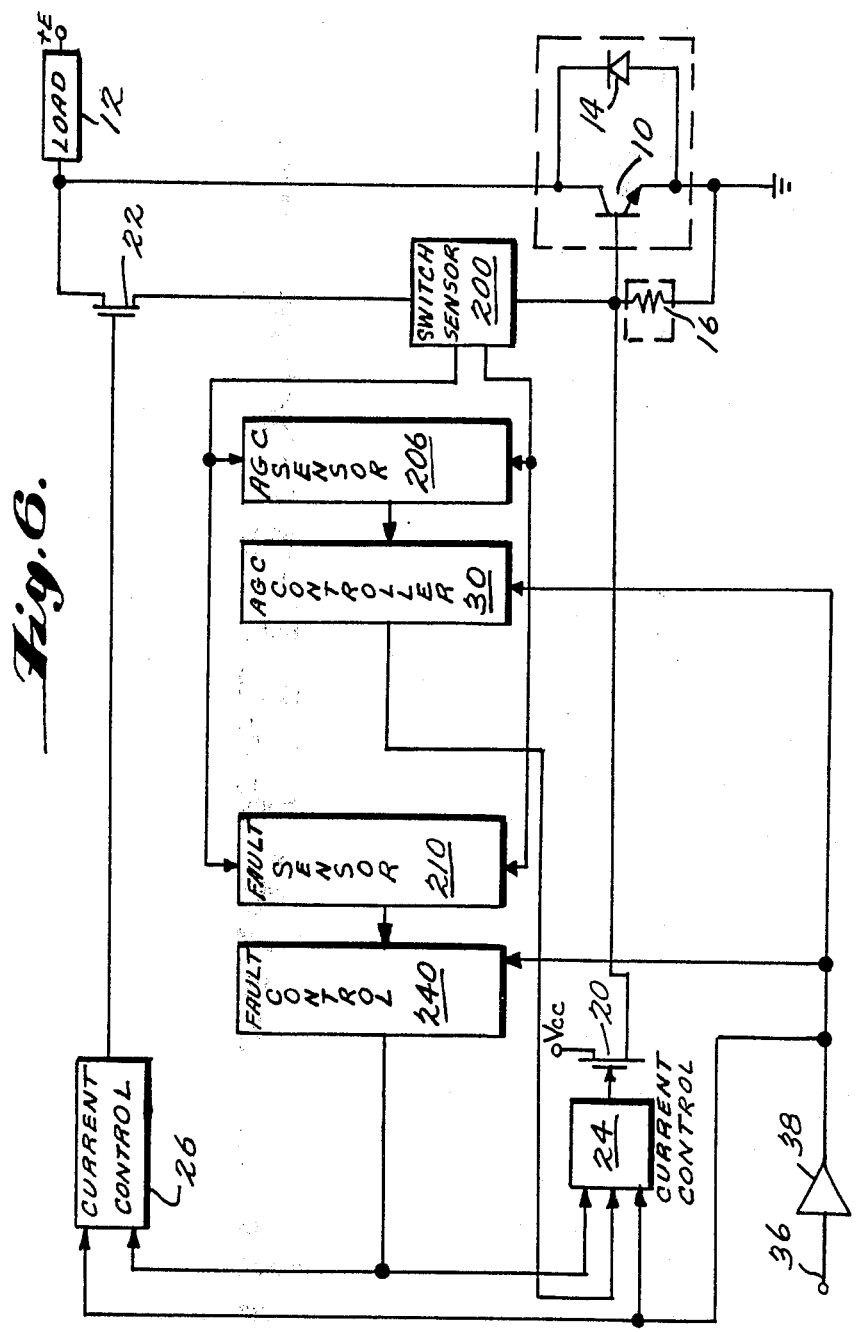
FIG. 6 is a simplified block diagram of a second preferred embodiment of the present invention.

Refer now to FIG. 6 which is an alternative embodiment of the present invention. In this embodiment the fault sensor and AGC sensor circuits are not connected across the base collector junction of the transistor switch 10 as in the preferred embodiment, but rather a sensing element 200 connected between the VMOS 22 and the base of the transistor switch 10 serves to detect the state of operation of the transistor 10 to determine when a fault condition occurs and, in addition, to control the level of primary current coupled to the base of the power transistor. As disclosed more specifically in FIG. 7, the sensing element 200 comprises a resistor 202 and a diode 204 connected in series between the source of VMOS transistor 22 and the base of the output power transistor 10.

The purpose for the diode 204 is to allow the secondary or transient current to flow essentially unimpeded into the base of the power output transistor 10 during the non-saturated turn-on and the non-saturated turn-off stages, while blocking current flow in the opposite direction when the power output switch 10 is in a saturated condition. It is to be understood that the diode 204 may be omitted since the resistor 202 will have a voltage drop proportional to the collector-base voltage of the power output transistor 10. The use of the diode 204 in this embodiment, however, avoids any additional power dissipation that would be caused by part of the primary current flowing from the base to the collector of the power output transistor 10 through the VMOS device 22 and permits direct measurement of the collector-base voltage of the power output transistor 10.

It is possible to directly measure the collector-base voltage of the power output transistor 10 because the VMOS device 22, which is turned hard ON and and can conduct current in either direction between its source and drain terminals, has a resistance of approximately 1 ohm. The current from the AGC sensor is less than 50 milliamps so that the voltage drop across the VMOS device 22 is approximately 0.05 volts. Therefore, the source of the VMOS device 22 and the collector of the power output transistor 10 are at approximately at the same potential.

The purpose of the resistor 202 is to develop a voltage drop proportional to the collector-base voltage of the power output transistor 10. As discussed above, the resistor 202 is unnecessary if the diode 204 is used as the sensing element and sensing of the collector-base voltage is desired during only the saturated conduction states when the diode 204 is reverse-biased. If sensing is desired during the non-saturated turn-on and/or turn-off stages, the resistor 202 has to be included in the sensing element 200.

Figure 7:
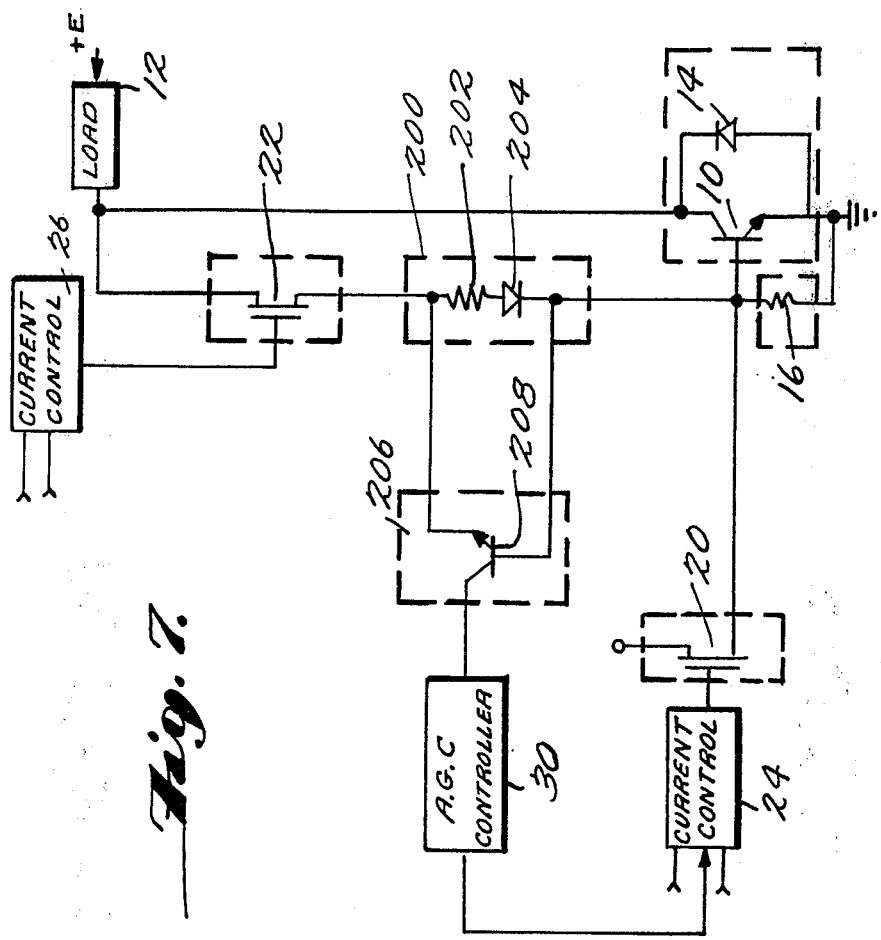
FIG. 7 is a schematic diagram of an automatic gain control system according to the second embodiment of the present invention.

The AGC sensor 206 of the second embodiment is also shown in FIG. 7. A transistor 208 has a collector lead connected to the AGC controller 30 which is illustrated in detail in FIG. 2. The emitter of the transistor 208 is connected to the resistor 202. The base of the transistor 208 is connected to the cathode of the diode 204.

Steady-state operation of the AGC sensor 206 is as follows. The transistor 206 is active during steady-state operation and typically has a voltage drop of approximately 0.6 volts across the base and emitter thereof. The diode 204 is reverse-biased, and the VMOS device 22 is turned hard ON and can conduct current in either direction between its source and drain terminals. Because the voltage drop across the VMOS device 22 is only about 0.05 volts, the emitter of the transistor 208 and the collector of the output power transistor 10 are at essentially the same potential. Furthermore, the base of the transistor 208 is connected to the base of the power transistor 10. Therefore, throughout the entire control range of the linear AGC, the output power transistor 10 base-collector voltage is approximately equal to the base-emitter voltage of the transistor 208. The transistor 208, in cooperation with the AGC controller 30 and the current driver 24, thereby maintain the output power transistor 10 in a saturated conduction state.

Figure 8:
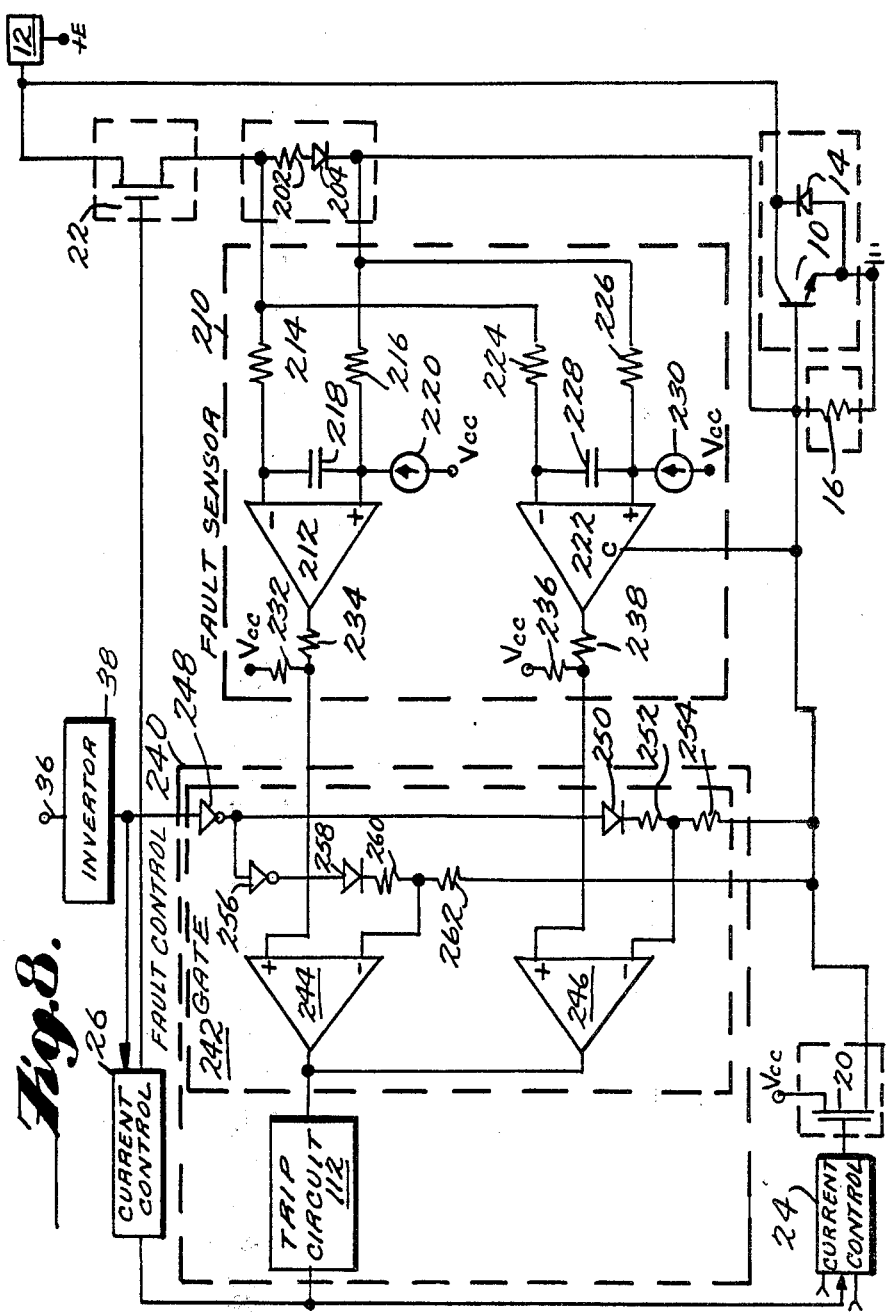
FIG. 8 is a schematic diagram of a fault system according to the second embodiment of the present invention.

Refer now to FIG. 8 which is an alternative embodiment of the fault sensing and fault gating circuit utilized in the alternate embodiment of FIG. 6. This second embodiment of the fault sensor not only detects proper operation of the output transistor 10 during steady-state operation thereof, but also detects faults during the non-saturated turn-off stage of operation. This is achieved by having two detectors provided with separate trip voltage levels. In FIG. 8 the fault sensor 210 includes an operational amplifier 212 having its inputs connected across the resistor 202 and diode 204 by way of input resistors 214 and 216. A capacitor 218 is connected across the input terminals of the operational amplifier which prevents noise signals and transient faults from causing operation of the fault system. A constant current diode 220 is connected at one end to the operating voltage supply $V_{CC}$ and at the other end to the non-inverting input of the operational amplifier 212. The constant current diode 220 is chosen such that the voltage drop across the resistor 216 is equal to a predetermined transient current trip point.

A second operational amplifier 222 is connected across the resistor 202 and diode 204 by means of input resistors 224 and 226. A capacitor 228 is connected across the input terminals of this operational amplifier so that the fault system is not activated by noise or by a very short duration fault condition. A constant current diode 230 is connected to the operating voltage $V_{CC}$ at one end and to the non-inverting input of the operational amplifier 222 at the other end. The constant current diode 230 is chosen such that the voltage drop across the resistor 226 is equal to a predetermined steady-state trip point.

Under a no-fault condition, the output of operational amplifier 212 is high and, accordingly, the voltage at the junction of resistors 232 and 234 goes to the operating voltage level $V_{CC}$. When, however, a fault condition occurs, the voltage at the non-inverting input of the operational amplifier 212 will become negative with respect to the voltage at the inverting input thereof.

Accordingly, the output of the operational amplifier 212 will go low. The resistors 232 and 234 are chosen such that the voltage therebetween is one-third the operating voltage $V_{CC}$ when the output of the operational amplifier 212 goes low.

The operation of the operational amplifier 222 and its associated output circuitry, including resistors 236 and 238 is the same as that for operational amplifier 212 with the exception that the trip points for detecting a fault condition are different. The operational amplifier 212 is adapted to sense a fault occuring in the non-saturated, turn-off stage while the operational amplifier 222 is adapted to sense a fault occurring during the steady-state saturation operation of transistor 10. Accordingly, the capacitor 218 is set so that it will charge rapidly to detect relatively short term transient fault conditions whereas capacitor 228 is of a value which will permit slower charging so that only long term faults under steady-state conditions will cause charging thereof resulting in a change of output of the operational amplifier 222.

The fault controller 240 includes a gating circuit 242 and a local trip point circuit 112. The local trip circuit 112 is identical to the local trip circuit 112 disclosed in FIG. 3 and, accordingly, the description thereof will not be repeated herein. The gate circuit 242 serves to inhibit promulgation of certain fault signals while the start-stop switch is turned off and during the initial turn-on stage thereof. The gating circuit 242 includes a first operational amplifier 244 having its non-inverting input connected to the junction of resistors 232 and 234 in the fault sensor circuit 210. A second operational amplifier 246 has its non-inverting input connected to the junction of resistors 236 and 238 of the fault sensing circuit 210. The inverting inputs to the operational amplifiers 244 and 246 are derived from the inverter 38 which, as aforementioned, receives switch control signals from an appropriate logic circuit. The output of the inverter 38 is connected to an inverter 248, the output of which is coupled to the inverting input of operational amplifier 246 via diode 250 and a voltage divider circuit comprising resistors 252 and 254. The output of inverter 248 is also coupled to a second inverter 256, the output of which is coupled to the inverting input of operational amplifier 244 via diode 258 and the voltage divider circuit including resistors 260 and 262. In operation, when a signal is provided to the power switch of the present invention to cause turn on of the power transistor 10, the turn-on signal is coupled through the inverter 38 and the inverter 248 so that the output of the inverter 248 is high. Diode 250 is, accordingly, forward-biased thereby establishing a voltage at the inverting input of operational amplifier 246 which is higher than that of the non-inverting input. The reason for this is that the values of the resistors 252 and 254 are chosen so that the voltage therebetween is two-thirds the operating voltage $V_{CC}$ applied to the divider network at the cathode of diode 250. During normal operation of the power switch, the output of operational amplifier 222 is high and, accordingly, the non-inverting input to operational amplifier 246 is substantially $V_{CC}$. Since this is higher than the non-inverting input voltage, the output of the operational amplifier 246 is high.

However, if a fault condition should occur, a potential one-third of the operating voltage $V_{CC}$ is applied to the non-inverting input of the operational amplifier 246. This results in the output of the operational amplifier 246 going low and, accordingly, the transistor 58

(shown in FIG. 3) in the local trip circuit 112 is turned on thereby causing base current flow to the power transistor 10 to be inhibited. During this time when the input from the logic circuit to the inverter 38 is high the output of inverter 256 is low thereby reverse-biasing diode 258. Accordingly, regardless of the output of the operational amplifier 212 in the fault sensor, no change in the status of operational amplifier 244 will occur. When a turn-off signal is coupled to the inverter 38 from the logic circuit, the output of inverter 38 goes high and the output of inverter 248 goes low. The diode 250 is thereby reversed-biased to thereby inhibit any change of output state of the operational amplifier 246. However, diode 258 will now be forward-biased thereby applying a voltage of two-thirds $V_{CC}$ to the inverting input of operational amplifier 244 because of the resistive values of the voltage divider network consisting of resistors 260 and 262. Should the output of operational amplifier 212 in the fault sensor 210 go low because of a detected transient fault, the output of operational amplifier 244 will go low to thereby indicate that a fault has occurred. This signal will cause the local trip circuit 112 to operate to shut down all base current flow to the transistor switch 10.

Refer now to FIG. 9 which discloses a circuit for overriding the operation of the AGC sensor 28 or 206 and the AGC controller 30 in order to hold the primary base current to the power output transient at a pedetermined maximum level. In order to accomplish this, a current sensing element 400 is positioned in circuit between the VMOS transistor 20 and the base of the transistor power output switch 10. In the preferred embodiment, this current sensing element is a resistor having a low value, however, it should be appreciated that other current sensing devices known in the art can be used. The value of the resistor 400 should be low since the base current drive from the VMOS device 20 can go as high as 10 amperes. Accordingly, in order to minimize power dissipation, it is desired that the voltage drop across the sensing resistor be maintained in the millivolt range. The voltage detected across the resistor 400 is coupled to a current limiting controller circuit 401 illustrated in FIG. 9. The output of this circuit is coupled to the driver circuit 24 which is disclosed in detail in FIG. 4. More specifically, the output from the current limiting circuit 401 is coupled directly to the base of transistor 130.

The current limiting circuit 401 includes a first amplifier 410 which is configured for minimum offset voltage and temperature drift. The resistors 404 and 406 are selected to provide a gain for the amplifier such that the output of the operational amplifier 410 will be about 1 volt when the voltage across the sensing resistor 400 reaches a value indicative of the maximum desired primary current. The input resistor 402 is used to balance the input offset currents and the capacitor 408 limits the high frequency gain of the operational amplifier 410.

A second operational amplifier 420 is provided for receiving the output of operational amplifier 410 via resistor 412. The other input to the operational amplifier 420 is derived from the voltage across resistor 418. This voltage is set by means of a constant current diode 416 which is connected at one end to the operating voltage $V_{CC}$ and at the other end to the resistor 418. The voltage drop across resistor 418 is set at 1 volt by the current from the constant current diode 416. Accordingly, the operational amplifier 420 amplifies the difference between the output of the operational amplifier 410 and the voltage drop of cross resistor 418. The value of feedback resistor 422 and resistor 418 is set such that the gain of the operational amplifier 420 is in the neighborhood of 100 or less in order to provide appropriate drive current for output transistor 430. The high frequency gain of the operational amplifier 420 is limited by means of feedback capacitor 424.

When the primary current to the base of the power transistor 10 reaches a certain maximum level, operational amplifier 420 will provide a positive going output signal which will turn transistor 430 on. With transistor 430 turned on, the voltage applied to the base of transistor 130 (see FIG. 4) is fixed at a level such as to limit the level of primary current provided to the base of the power transistor 10. This has the effect of overriding the AGC control system but, of course, will not override the fault controller system or the signal from the switching logic circuit to the input inverter 38.

While the present invention has been described in connection with the preferred embodiments thereof, it should be understood that there may be other obvious modifications or embodiments of the present invention which fall within the spirit and scope of the invention as defined by the appended claims.

What is claimed is:
1. An automatic bias-controlled switch comprising:
bipolar power switching transistor means having a collector electrode connected to a high-power operating voltage source, an emitter electrode connected to a source of reference potential, and a base electrode for receiving a base control current;
an input terminal for receiving a switch control signal;
a programmable base current supply connected between said input terminal and said base electrode of said bipolar power transistor means, said base current supply comprising primary base current control means responsive to said switch control signal for supplying primary current of sufficient magnitude to said base electrode for turning on said transistor means at least into an unsaturated conduction state when said switch control signal is at a first level, and secondary base current control means responsive to said switch control signal for supplying a secondary current to said base electrode of said transistor means a predetermined time after said primary current is supplied thereto to further drive said transistor means toward saturation and for minimizing power dissipation of transistor means, one of said primary and secondary current control means being responsive to a second level of said switch control signal for initially reducing the magnitude of current supplied to said base electrode a sufficient amount to insure said transistor means being placed in an unsaturated conduction state, and a predetermined time thereafter the other of said primary and secondary base current control means reducing the magnitude of current being supplied to said base electrode to substantially zero for turning off said transistor means;
a sensing means connected to said transistor means for generating a signal proportional to the base-collector voltage thereof; and
feedback means connected between said sensing means and said programmable base current supply for controlling the base current to said transistor means, said base current being in proportion to said generated base-collector voltage proportional sig- nal wherein said feedback means increases the base current when said base-collector voltage increases and decreases said base current when said base-collector voltage decreases.

2. The automatic bias-controlled switch of claim 1 wherein said feedback means further comprises inhibiting means for inhibiting said signal proportional to the the base-collector voltage from controlling said base current for a predetermined time after said power transistor means is turned on.

3. The automatic bias-controlled switch of claims 1 or 2 wherein said sensing means comprises an amplifier; and
means for connecting said amplifier across the collector and base terminals of said power switch for generating a signal proportional to the base-collector voltage thereof.

4. An automatic bias-controlled switch of claim 3 wherein said amplifier connecting means comprises means for isolating said high-power operating voltage source from said amplifier.

5. The automatic bias-controlled switch of claims 1 or 2 wherein said sensing means comprises means connected between the base of said power switch and said secondary base current control means for detecting a voltage proportional to the base-collector voltage of said power transistor means; and
amplifier means connected to said detecting means for amplifying said base-collector voltage, said amplifier output being connected to said feedback means.

6. The automatic bias-controlled switch of claim 5 wherein said sensing means is a diode connected between said base of said power transistor means and said secondary base current control means.

7. The automatic bias-controlled switch of claim 5 wherein said sensing means is a resistor connected between said base electrode of said power transistor means and said secondary base current control means.

8. The automatic bias-controlled switch of claim 5 wherein said sensing means includes a resistor and a diode connected in series between said base electrode of said power transistor means and said secondary base current control means.

9. The automatic bias-controlled switch of claim 5 wherein said amplifier is a transistor having its base and emitter electrodes connected across said sensing means.

10. An automatic bias-controlled switch comprising:
bipolar power switching transistor means having a collector electrode connected to a high-power operating voltage source, an emitter electrode connected to a source of reference potential, and a base electrode for receiving a base control current;
an input terminal for receiving a switch control signal;
a programmable base current supply connected between said input terminal and said base electrode of said bipolar power transistor means, said base current supply comprising primary base current control means responsive to said switch control signal for supplying primary current of sufficient magnitude to said base electrode for turning on said transistor means at least into an unsaturated conduction state when said switch control signal is at a first level, and secondary base current control means responsive to said switch control signal for supplying a secondary current to said base electrode of said transistor means a predetermined time after said primary current is supplied thereto to further drive said transistor means toward saturation and for minimizing power dissipation of transistor means, one of said primary and secondary current control means being responsive to a second level to said switch control signal for initially reducing the magnitude of current supplied to said base electrode a sufficient amount to insure said transistor means being placed in an unsaturated conduction state, and a predetermined time thereafter the other of said primary and secondary base current control means reducing the magnitude of current being supplied to said base electrode to substantially zero for turning off said transistor means;
a sensing means connected to said transistor means for generating a signal having an amplitude proportional to the base-collector voltage thereof;
feedback means connected between said sensing means and said programmable base current supply for controlling the magnitude of the base current supplied to said base of said transistor means, said base current being in proportion to said generated base-collector voltage proportional signal wherein said feedback means increases the base current when said base-collector voltage increases and decreases said base current when said base-collector voltage decreases;
fault sensing means connected across said emitter and collector electrodes of said power transistor means for generating a monitoring voltage having an amplitude proportional to the amplitude of the voltage across said collector-emitter electrodes of said power transistor means;
comparator means for comparing said monitoring voltage with a preset voltage and for generating a fault voltage when said monitoring voltage exceeds said preset voltage; and
means connected to said comparing means for receiving said fault voltage and for inhibiting said primary and secondary current control means when a fault voltage is generated to thereby turn off said power transistor means.

11. The automatic bias-controlled power switch of claim 10 wherein said means for receiving said fault voltage comprises delay means for delaying for a predetermined time the transmission of said fault voltage to said primary and secondary base current control means thereby insuring that relatively short-term transients in the collector-emitter voltage of said power transistor means do not inhibit said primary and secondary base current control means.

12. The automatic bias-controlled power switch of claim 11 wherein said fault signal connecting means further comprises inhibiting means for inhibiting the transmission of said fault voltage to said primary and secondary base current control means until a predetermined time after said switch control signal goes to said first level to turn said power transistor means on.

13. An automatic bias-controlled power switch comprising:
bipolar power switching transistor means having a collector electrode connected to a highpower operating voltage source, an emitter electrode connected to a source of reference potential, and a base electrode for receiving a base control current;
an input terminal for receiving a switch control signal;

a programmable base current supply connected between said input terminal and said base electrode of said bipolar power transistor means, said base current supply comprising primary base current control means responsive to said switch control signal for supplying primary current of sufficient magnitude to said base electrode for turning on said transistor means at least into an unsaturated conduction state when said switch control signal is at a first level, and secondary base current control means responsive to said switch control signal for supplying a secondary current to said base electrode of said transistor means a predetermined time after said primary current is supplied thereto to further drive said transistor means toward saturation and for minimizing power dissipation of transistor means, one of said primary and secondary current control means responsive to a second level of said switch control signal for initially reducing the magnitude of current supplied to said base electrode a sufficient amount to insure said transistor means being placed in an unsaturated conduction state, and a predetermined time thereafter the other of said primary and secondary base current control means reducing the magnitude of current being supplied to said base electrode to substantially zero for turning off said transistor means;

a sensing means connected to said transistor means for generating a signal proportional to the base-collector voltage thereof;

feedback means connected between said sensing means and said programmable base current supply for controlling the base current to said transistor means, said base current being in proportion to said generated base-collector voltage proportional signal wherein said feedback means increases the base current when said base-collector voltage increases and decreases said base current when said base-collector voltage decreases; and current sensing means connected between the base electrode of said power transistor means and said secondary current control means for providing, whenever said secondary base current control means is turned on, a monitoring voltage having an amplitude corresponding to the magnitude of current flowing through the collector-emitter electrode current path of said power transistor means, at least one comparator means connected across said current sensing means for comparing said monitoring voltage with a voltage of predetermined amplitude, said at least one comparing means generating a fault output signal when said monitoring voltage exceeds said voltage having a predetermined amplitude, and gating means for transmitting said fault signal to said primary and secondary current control means for inhibiting base current to said power transistor means when said monitoring voltage exceeds said voltage having said predetermined amplitude.

14. The automatic bias-controlled power switch of claim 13 further comprising a second comparing means connected across said current sensing means and responsive to said monitoring voltage exceeding a second voltage having a second predetermined amplitude, said second comparing means generating a second fault signal when said monitoring voltage exceeds said second voltage, and wherein said gating means receives said fault signal and controllably couples said second fault signal to said primary and secondary base current control means, wherein the amplitude of said first voltage of said first comparing means corresponds to a fault in the steady-state saturation conduction state of said power transistor means and the amplitude of said second voltage corresponds to a fault in the unsaturated turn-off state of said power transistor means.

15. The automatic bias-controlled power switch of claims 13 or 14 further comprising delay means for delaying for a predetermined time the application of said monitoring voltage to said comparing means to thereby insure that relatively short-term transients in the magnitude of current flowing through said current sensing means do not cause turn off of base current to said power transistor means from said primary and secondary base current control means.

16. The automatic bias-controlled power switch comprising:

bipolar power switching transistor means having a collector electrode connected to a high-power operating voltage source, an emitter electrode connected to a source of reference potential, and a base electrode for receiving a base control current;

an input terminal for receiving a switch control signal;

a programmable base current supply connected between said input terminal and said base electrode of said bipolar power transistor means, said base current supply comprising primary base current control means responsive to said switch control signal for supplying primary current of sufficient magnitude to said base electrode for turning on said transistor means at least into an unsaturated conduction state when said switch control signal is at a first level, and secondary base current control means responsive to said switch control signal for supplying a secondary current to said base electrode of said transistor means a predetermined time after said primary current is supplied thereto to further drive said transistor means toward saturation and for minimizing power dissipation of transistor means, one of said primary and secondary current control means being responsive to a second level of said switch control signal for initially reducing the magnitude of current supplied to said base electrode a sufficient amount to insure said transistor means being placed in an unsaturated conduction state, and a predetermined time thereafter the other of said primary and secondary base current control means reducing the magnitude of current being supplied to said base electrode to substantially zero for turning off said transistor means;

a sensing means connected to said transistor means for generating a signal proportional to the base-collector voltage thereof;

feedback means connected between said sensing means and said programmable base current supply for controlling the base current to said transistor means, said base current being in proportion to said generated base-collector voltage proportional signal wherein said feedback means increases the base current when said base-collector voltage increases and decreases said base current when said base-collector voltage decreases; and base current sensing means for detecting the level of current flow to said base of said power transistor means, comparing means connected to said base current sensing means for generating a base current limit control signal when said sensed current exceeds a predetermined level, and current limiting feedback means connected between said comparing means and said programmable base current supply for limiting said base current to said predetermined level.

17. The automatic bias-controlled power switch of claim 16 wherein said base current sensing means is a resistor connected between said primary base current control means and said base electrode of said power transistor means and wherein said current limiting feedback means is connected to said primary base current control means for limiting said base current to said predetermined level.

18. The automatic bias-controlled power switch of claim 16 wherein said base current sensing means includes a resistor connected between said primary base current control means and the base of said power transistor means and an amplifier connected across said resistor for amplifying the voltage developed thereacross and wherein said comparing means is connected to the output of said amplifier for generating a base current limiting control signal when said sensed voltage exceeds a predetermined level.

19. The automatic bias-controlled power switch of claim 16 wherein said feedback means further comprises inhibiting means for inhibiting said signal proportional to the base-collector voltage for controlling said base current for a predetermined time after said power transistor means is turned on.

20. The automatic bias-controlled power switch of claim 16 further comprising fault sensing means connected across said emitter and collector electrodes of said power transistor means for generating a monitoring voltage having an amplitude proportional to the amplitude of the voltage across said collector-emitter electrodes of said power transistor means;

comparator means for comparing said monitoring voltage with a preset voltage and for generating a fault voltage when said monitoring voltage exceeds said predetermined voltage; and means connected to said comparing means for receiving said fault voltage and for inhibiting said primary and secondary current control means when a fault voltage is generated to thereby turn off said power transistor means.

21. The automatic bias-controlled power switch of claim 20 wherein said means for receiving said fault voltage comprises delay means for delaying for a predetermined time the transmission of said fault voltage to said primary and secondary base current control means thereby insuring that a relatively short-term transient in the collector-emitter voltage of said power transistor does not inhibit said primary and secondary base current control means.

22. The automatic bias-controlled power switch of claim 21 wherein said fault signal connecting means further comprises inhibiting means for inhibiting the transmission of said fault voltage to said primary and secondary base current control means until a predetermined time after said switch control signal goes to said first level to turn said power transistor means on.

23. In an automatic bias-controlled power switch comprising:

bipolar power switching transistor means having a collector electrode connected to a high-power operating voltage source, an emitter electrode connected to a source of reference potential, and a base electrode for receiving a base control current;

an input terminal for receiving a switch control signal;

a programmable base current supply connected between said input terminal and said base electrode of said bipolar power transistor means, said base current supply comprising primary base current control means responsive to said switch control signal for supplying primary current of sufficient magnitude to said base electrode for turning on said transistor means at least into an unsaturated conduction state when said switch control signal is at a first level, and secondary base current control means responsive to said switch control signal for supplying a secondary current to said base electrode of said transistor means a predetermined time after said primary current is supplied thereto to further drive said transistor means toward saturation and for minimizing power dissipation of transistor means, one of said primary and secondary current control means being responsive to a second level of said switch control signal for initially reducing the magnitude of current supplied to said base electrode a sufficient amount to insure said transistor means being placed in an unsaturated conduction state, and a predetermined time thereafter the other of said primary and secondary base current control means reducing the magnitude of current being supplied to said base electrode to substantially zero for turning off said transistor means; and a method of controlling base current to said switch comprising the steps of:

generating a signal proportional to the base-collector voltage of said bipolar power switching transistor means, and controlling in response to said generated signal said programmable base current supply to thereby control the base current for said power transistor means in accordance with the generated base-collector voltage proportional signal wherein the base current increases when said base-collector voltage increases and the base current decreases when said base-collector voltage decreases.

24. The method of claim 23 further comprising the step of inhibiting said generated signal for a predetermined time after said power transistor means is turned on.

25. The method of claim 24 further comprising the steps of:

sensing the voltage across the collector and emitter of said power transistor means;

generating a monitoring voltage in response thereto having an amplitude proportional to the amplitude across said collector-emitter electrodes of said power transistor means;

comparing said monitoring voltage with a preset voltage;

generating a fault voltage when said monitoring voltage exceeds said preset voltage; and inhibiting said primary and secondary current control means when said fault voltage is generated to thereby turn off said power transistor means.

26. The method of the claim 25 further comprising the steps of:

sensing the base current flow to said base of said power transistor means;

converting said sensed base current to a voltage proportional thereto;

comparing said voltage with a predetermined voltage, and when said voltage exceeds said predetermined voltage, generating a current limiting signal; and coupling said current limiting signal to said programmable base current supply for limiting said base current to said predetermined level.

* * * * *